(12) United States Patent
Mihara et al.

(10) Patent No.: US 12,374,509 B2
(45) Date of Patent: Jul. 29, 2025

(54) DISCONNECT DEVICE

(71) Applicant: Panasonic Intellectual Property Management Co., Ltd., Osaka (JP)

(72) Inventors: Hiroyuki Mihara, Hyogo (JP); Hayato Ashida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 194 days.

(21) Appl. No.: 18/552,197

(22) PCT Filed: Feb. 4, 2022

(86) PCT No.: PCT/JP2022/004539
§ 371 (c)(1),
(2) Date: Sep. 25, 2023

(87) PCT Pub. No.: WO2022/215339
PCT Pub. Date: Oct. 13, 2022

(65) Prior Publication Data
US 2024/0177948 A1    May 30, 2024

(30) Foreign Application Priority Data
Apr. 6, 2021 (JP) .................................. 2021-064505

(51) Int. Cl.
*H05K 7/20* (2006.01)
*H01H 9/52* (2006.01)
*H01H 45/00* (2006.01)

(52) U.S. Cl.
CPC .............. *H01H 9/52* (2013.01); *H01H 45/00* (2013.01)

(58) Field of Classification Search
CPC ........ H01H 45/00; H01H 45/04; H01H 50/04; H01H 9/52; H01M 10/44; H02H 3/087;
(Continued)

(56) References Cited

U.S. PATENT DOCUMENTS

| 11,322,325 B2 * | 5/2022 | Won ......................... B60R 16/02 |
| 2016/0107526 A1 * | 4/2016 | Jin ............................. B60L 7/10 |
| | | 307/10.1 |

(Continued)

FOREIGN PATENT DOCUMENTS

WO    2020/100612    5/2020

OTHER PUBLICATIONS

International Search Report of PCT application No. PCT/JP2022/004539 dated Apr. 19, 2022.

*Primary Examiner* — Ahmed M Saeed
(74) *Attorney, Agent, or Firm* — GREENBLUM & BERNSTEIN, P.L.C.

(57) ABSTRACT

A disconnect device includes a heatsink, a substrate, a first charging relay disposed on a first heat transfer part, a second charging relay disposed on a second heat transfer part, a first discharging relay disposed on a third heat transfer part, a second discharging relay disposed on a fourth heat transfer part, and first and second power storage ends. The first and second discharging relays are disposed closer to the first and second power storage ends than the first and second charging relays are. The first, second, third, and fifth heat transfer parts are aligned in a first direction. The fourth and fifth heat transfer parts are aligned in a second direction perpendicular to the first direction. A heat dissipating performance of the heatsink on the third, fourth, and fifth heat transfer parts is higher than a heat dissipating performance of the heatsink on the first and second heat transfer parts.

2 Claims, 4 Drawing Sheets

(58) Field of Classification Search
CPC ........... H05K 7/20909; H05K 7/20145; H05K 7/20154; H05K 7/209; H05K 7/2039; H05K 7/20918; H05K 1/0203; H05K 1/147; H05K 1/148; H05K 1/18; H05K 2201/064; H05K 2201/066; H05K 3/4691; H05K 7/1417; H05K 7/14325; H05K 7/1461; H05K 7/1492; H05K 7/20136; H05K 7/20336; H05K 7/20409; H05K 7/20545; H05K 7/20581; H05K 7/207; H01L 23/467; H01L 23/3672; H01L 21/4882; H01L 23/3675
See application file for complete search history.

(56) References Cited

U.S. PATENT DOCUMENTS

2020/0303788 A1\* 9/2020 Rheaume ............ H01M 10/637
2021/0383985 A1   12/2021 Mori et al.

\* cited by examiner

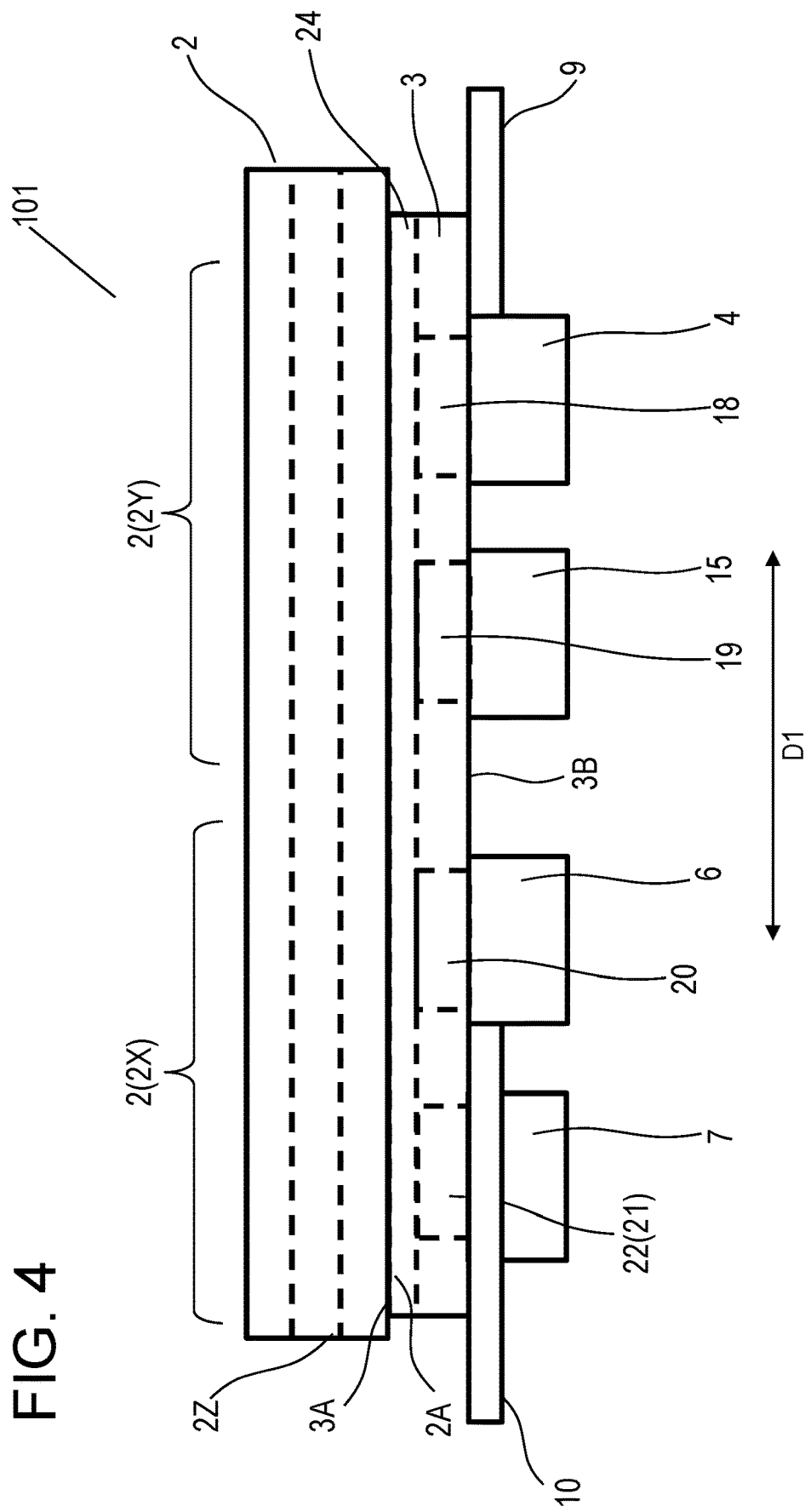

DISCONNECT DEVICE

TECHNICAL FIELD

The present disclosure relates to a disconnect device usable in electronic equipment for various vehicles.

BACKGROUND ART

A conventional disconnect device includes a base, relays fixed to the base, and a protection device for protecting the relays or devices connected to the relays when an overcurrent flows through the relays. The relays are separated with large intervals from one another, and suppresses a temperature rise in the relays and the protection device.

PTL 1 discloses a conventional disconnect device similar to the disconnect device mentioned above.

CITATION LIST

Patent Literature

PTL 1: International Publication No. WO2020/100612

SUMMARY OF THE INVENTION

A disconnect device is configured to operate together with a power storage element including a first electrode and a second electrode. The disconnect device includes a heatsink, a substrate having a first surface contacting the heatsink and having a second surface opposite to the first surface, first and second charging relays, first and second discharging relays, and first and second charging ends. The substrate further has first to fourth edges connected to the first and second surfaces, and includes first to fifth heat transfer parts which are provided along the second surface of the substrate. The first charging relay contacts the first heat transfer part. The second charging relay contacts the second heat transfer part. The first discharging relay contacts the third heat transfer part. The second discharging relay contacts the fourth heat transfer part. The first and second charging ends are led out from a first edge of the substrate. First and second output ends are led out from a second edge of the substrate and thermally coupled to the fifth heat transfer part. The first power storage end is led out from a third edge or a fourth edge of the substrate and is configured to be connected to the first electrode of the power storage element. The second power storage end is led out from the third edge or the fourth edge of the substrate, and is configured to be connected to the second electrode of the power storage element. Both the first discharging relay and the second discharging relay are disposed closer to the first power storage end and the second power storage end than both the first charging relay and the second charging relay are. The second edge of the substrate is positioned opposite to of the first edge of the substrate in a first direction. The first heat transfer part, the second heat transfer part, the third heat transfer part, and the fifth heat transfer part are arranged in the first direction. The fourth heat transfer part and the fifth heat transfer part are arranged in a second direction perpendicular to the first direction. A heat dissipating performance of the heatsink on the third heat transfer part, the fourth heat transfer part, and the fifth heat transfer part of the substrate is higher than a heat dissipating performance of the heatsink on the first heat transfer part and the second heat transfer part of the substrate.

The disconnect device enhances operation reliability while suppressing an increase of a size thereof.

BRIEF DESCRIPTION OF THE DRAWINGS

FIG. 4 is a side schematic diagram of another disconnect device in accordance with the embodiment.

DESCRIPTION OF EMBODIMENT

Figure 1:
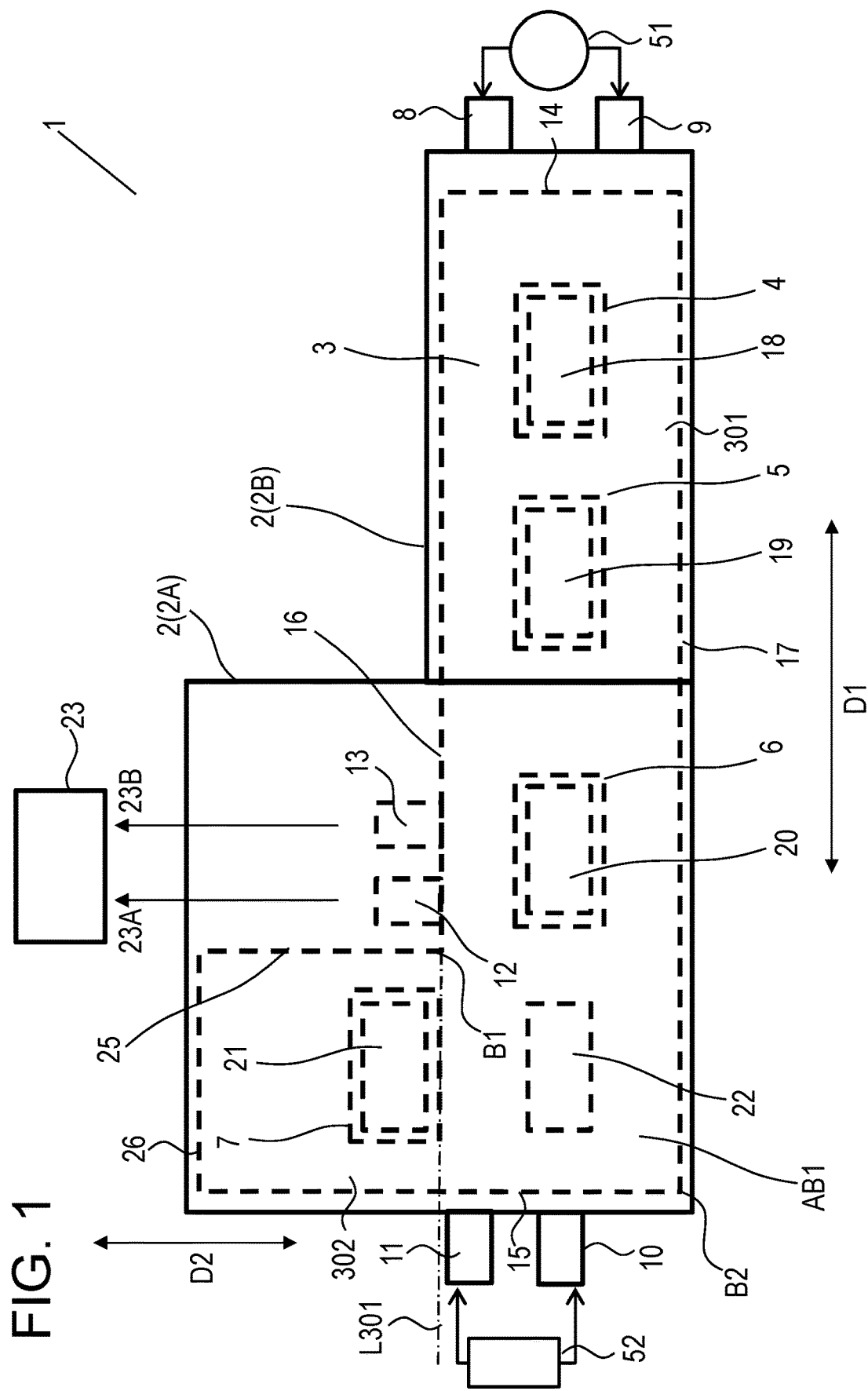
FIG. 1 is a top schematic diagram of a disconnect device in accordance with an exemplary embodiment of the present disclosure.
Figure 2:
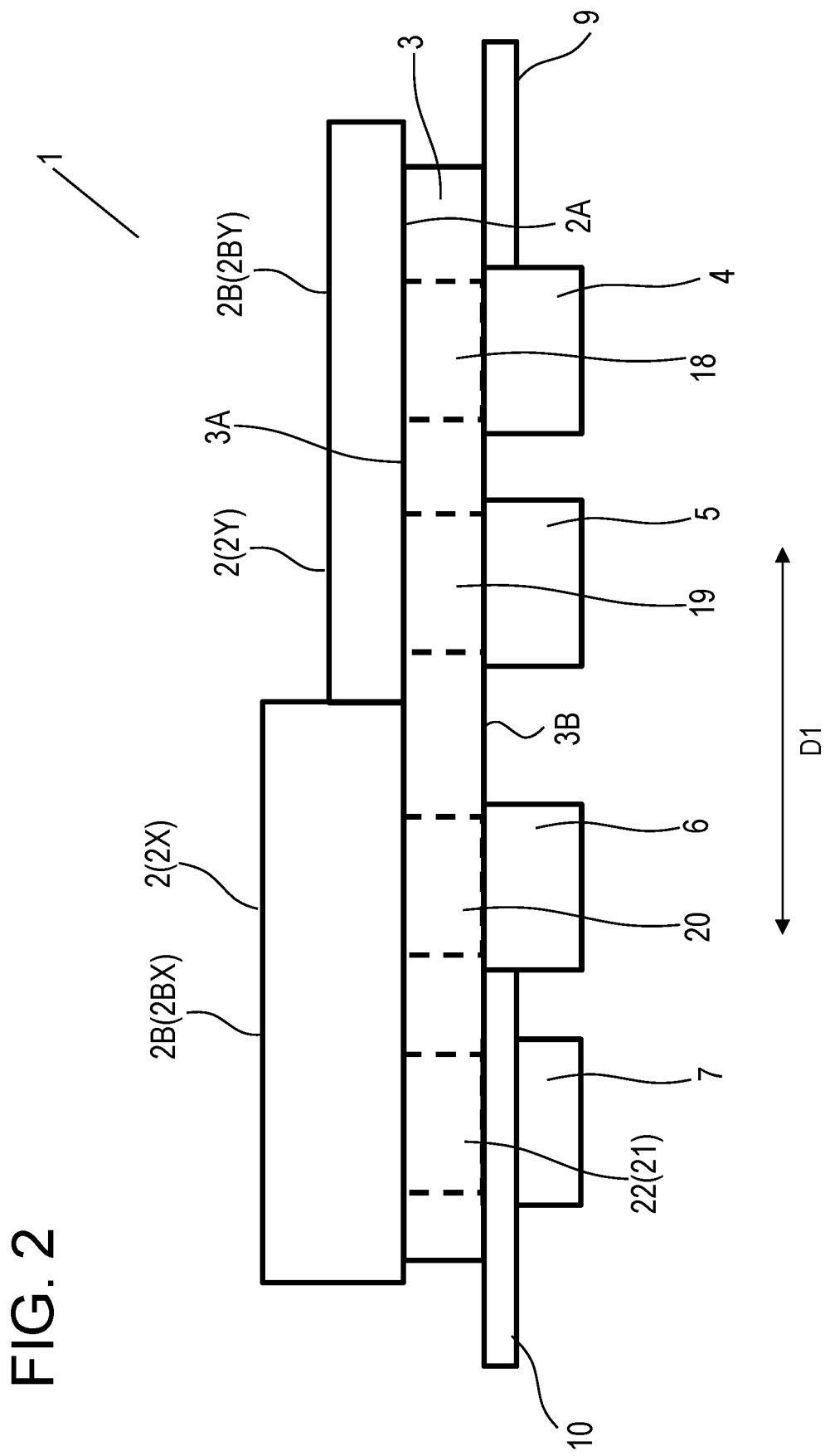
FIG. 2 is a side schematic diagram of the disconnect device shown in FIG. 1.

FIG. 1 is a top schematic diagram of disconnect device 1 in accordance with an exemplary embodiment of the present disclosure. FIG. 2 is a side schematic diagram of disconnect device 1.

Disconnect device 1 includes heatsink 2, substrate 3, charging relay 4, charging relay 5, discharging relay 6, discharging relay 7, charging end 8, charging end 9, output end 10, output end 11, power storage end 12, and power storage end 13.

Heatsink 2 has surfaces 2A and 2B opposite to each other. Substrate 3 has surfaces 3A and 3B opposite to each other. Surface 3A of substrate 3 contacts surface 2A of heatsink 2. Substrate 3 is provided on surface 2A of heatsink 2. Substrate 3 has least edge 14, edge 15, edge 16, and edge 17. Edges 14, 15, 16, and 17 are connected to surfaces 2A and 2B. Substrate 3 includes heat transfer part 18, heat transfer part 19, heat transfer part 20, heat transfer part 21, and heat transfer part 22. Heat transfer parts 18, 19, 20, 21, and 22 contact heatsink 2.

Charging relay 4 is disposed on surface 3B of substrate 3 and contact heat transfer part 18. Charging relay 5 is disposed on surface 3B of substrate 3 and contacts heat transfer part 19. Discharging relay 6 is disposed on surface 3B of substrate 3 and contacts heat transfer part 20. Discharging relay 7 is disposed on surface 3B of substrate 3 and contacts heat transfer part 21.

Charging end 8 and charging end 9 are led out from edge 14 of substrate 3. Output end 10 and output end 11 are led out from edge 15 of substrate 3. Edge 15 of substrate 3 is positioned opposite to edge 14. Edges 14 and 15 are arranged in direction D1 parallel to surfaces 3A and 3B of substrate 3, and extends in direction D2 perpendicular to direction D1 and parallel to surfaces 3A and 3B of substrate 3. Edges 14 and 15 are positioned opposite to each other in direction D1. Output end 10 is thermally coupled to heat transfer part 22.

Power storage end 12 and power storage end 13 are led out from edge 16 or edge 17 of substrate 3. Power storage end 12 is configured to be connected to electrode 23A of power storage element 23. Power storage end 13 is configured to be connected to electrode 23B of power storage element 23.

Both discharging relay 6 and discharging relay 7 are closer to both power storage end 12 and power storage end 13 than both charging relay 4 and charging relay 5 are. Heat transfer part 18, heat transfer part 19, heat transfer part 20, and heat transfer part 22 are aligned in direction D1. Heat transfer part 21 and heat transfer part 22 are aligned in direction D2 perpendicular to direction D1. A heat dissipating performance of heatsink 2 on heat transfer part 20, heat transfer part 21, and heat transfer part 22 is higher than a heat dissipating performance of heatsink 2 on heat transfer part 18 and heat transfer part 19.

In the above configuration, since a distance between electrodes 23A and 23B of power storage element 23 is small, a direct-current (DC) resistance of a conductor in of discharging relays 6 and 7 corresponding to a discharge path from power storage element 23 to output ends 10 and 11 in which a large electric current flows is reduced, accordingly suppressing heat generation. Furthermore, in discharging relay 6, discharging relay 7, and output end 10 in which heat is easily generated as the discharge path, the heat dissipating efficiency of thermally coupled heatsink 2 is enhanced, and suppresses a temperature rise of disconnect device 1. As a result, the operation reliability of the entire disconnect device can be enhanced.

In the conventional disconnect device mentioned above, the disconnect device in which relays are arranged at a large distance for suppressing a temperature rise has a large size accordingly. On the other hand, in arrangement in which the distance between the of relays are reduced, a temperature rise during operation of the relays may easily occur. Consequently, operation reliability of the disconnect device may be deteriorated.

Disconnect device 1 will be detailed below with reference to FIG. 1 and FIG. 2.

As described above, disconnect device 1 includes heatsink 2, substrate 3, charging relay 4, charging relay 5, discharging relay 6, discharging relay 7, charging end 8, charging end 9, output end 10, output end 11, power storage end 12, and power storage end 13.

Substrate 3 is made of a resin substantially having a plate shape or a plate shape with a frame portion. Surface 3A of substrate 3 contacts and faces surface 2A of heatsink 2. Charging relay 4, charging relay 5, discharging relay 6, and discharging relay 7 are disposed on surface 3B of substrate 3 opposite to surface 3A.

Substrate 3 includes heat transfer part 18, heat transfer part 19, heat transfer part 20, and heat transfer part 21 in order to efficiently transfer heat generated in charging relay 4, charging relay 5, discharging relay 6, and discharging relay 7 to heatsink 2, and to maintain electric insulation property between heatsink 2 and charging relay 4, charging relay 5, discharging relay 6, and discharging relay 7.

Heat transfer part 18 is provided between charging relay 4 and heatsink 2 and contacts both charging relay 4 and heatsink 2. Heat transfer part 19 is provided between charging relay 5 and heatsink 2 and contacts both charging relay 5 and heatsink 2. Heat transfer part 20 is provided between discharging relay 6 and heatsink 2 and contacts both discharging relay 6 and heatsink 2. Heat transfer part 21 is provided between discharging relay 7 and heatsink 2 and contacts both discharging relay 7 and heatsink 2. Discharging relay 6 is connected to output end 10. Heat transfer part 22 is provided between heatsink 2 and a conductor constituting output end 10 and contacts heatsink 2 and the conductor constituting output end 10.

Figure 3:
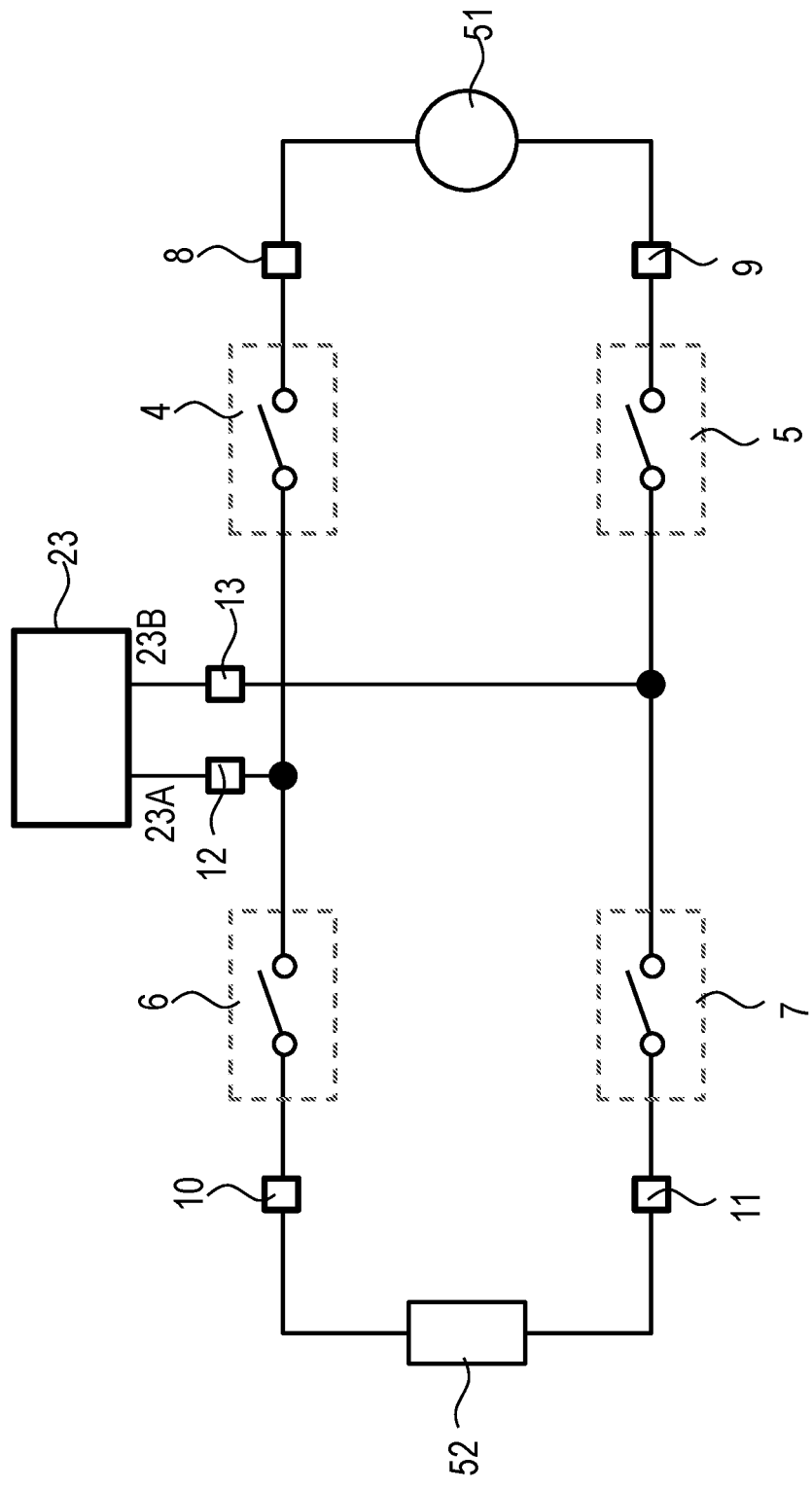
FIG. 3 is a circuit diagram of the disconnect device shown in FIG. 1.

FIG. 3 is a circuit diagram of disconnect device 1. For example, in the case that electrode 23A and electrode 23B of power storage element 23 are positive and negative electrodes, respectively, electrode 23A of power storage element 23 mounted on a vehicle is connected to power storage end 12 and coupled to charging end 8 via charging relay 4. Electrode 23B of power storage element 23 is connected to power storage end 13 and coupled to charging end 9 via charging relay 5. Charging end 8 and charging end 9 are configured to be connected to power feeding device 51 provided at an outside of the vehicle having disconnect device 1 mounted thereon. Power feeding device 51 is configured to supply electric power to charging ends 8 and 9.

Electrode 23A of power storage element 23 is coupled to output end 10 via discharging relay 6. Electrode 23B of power storage element 23 is coupled to output end 11 via discharging relay 7. Output end 10 and output end 11 are connected to load 52 mounted on the vehicle having disconnect device 1 mounted thereon. Load 52 is a drive device for moving the vehicle and includes, e.g., a DC-AC converter circuit and a motor.

An electric current flows through discharging relay 6 and discharging relay 7 while the vehicle is driven to run. Therefore, a large output electric current flows in discharging relay 6 and discharging relay 7, the value of this output electric current is frequently larger than the charge electric current flowing in charging relay 4 and charging relay 5 during charging operation of power storage element 23. Therefore, heat generation due to the DC resistance easily occurs in discharging relay 6 and discharging relay 7 and conductors connected to discharging relay 6 and discharging relay 7.

Thus, in this Example, particularly in order to suppress the DC resistance of discharging relay 6 and discharging relay 7 and the conductors coupled to discharging relay 6 and discharging relay 7, both discharging relay 6 and discharging relay 7 are disposed closer to both power storage end 12 and power storage end 13 than both charging relay 4 and charging relay 5 are. In other words, for example, in the case that the cross-sectional areas of the conductors are the same, a length of the conductor from electrode 23A of power storage element 23 to output end 10 via discharging relay 6 and a length of the conductor from electrode 23B of power storage element 23 to output end 11 via discharging relay 7 are shorter than a length of the conductor from electrode 23A of power storage element 23 to charging end 8 via charging relay 4 and a length of the conductor from electrode 23B of power storage element 23 to charging end 9 via charging relay 5. Therefore, the DC resistance from electrode 23A of power storage element 23 to output end 10 via discharging relay 6 and the DC resistance from electrode 23B of power storage element 23 to output end 11 via discharging relay 7 are smaller than the DC resistance from electrode 23A of power storage element 23 to charging end 8 via charging relay 4 and the DC resistance from electrode 23B of power storage element 23 to charging end 9 via charging relay 5. The reducing of the lengths of the conductors and the suppression of the resistances provide a large effect when the following two points are satisfied. Furthermore, the resistance value may be adjusted based on not only the relation of the length of the conductor, but also the increase in the cross-sectional area, and the size relation of the cross-sectional area.

The first point is that heat transfer part 18, heat transfer part 19, heat transfer part 20, and heat transfer part 22 are aligned in direction D1 in which edges 14 and 15 face each other. The second point is that heat transfer part 21 and heat transfer part 22 are aligned in direction D2 perpendicular to direction D1. Power storage end 12 and power storage end 13 are arranged easily at a shorter distance from discharging relay 6 and discharging relay 7.

Thus, power storage end 12 and power storage end 13 are provided on an edge of substrate 3 other than edge 14 or edge 15 of substrate 3. This configuration reduces a conductor length and the resistance. Substrate 3 preferably has an L-shape including six edges 14 to 17, 25, and 26 as shown in FIG. 1. Specifically, substrate 3 includes part 301 elongated in direction D1 and part 302 elongated in direction D2 connected to part 301 at region AB1. Part 301 of substrate 3 has edges 14, 16, and 17 while part 302 has edges 15, 25, and 26. In part 301, edges 16 and 17 are positioned opposite to each other. In part 302, edges 15 and 25 are positioned opposite to each other. Edges 16 and 25 are connected to each other at joint point B1 to form an inner periphery having an L-shape. Edges 15 and 17 are connected to each other at joint point B2 to form an outer periphery having an L-shape. Edge 14 constitutes an end of part 301 opposite to region AB1. Edge 26 constitutes an edge of part 302 opposite to region AB1.

Power storage end 12 and power storage end 13 are preferably provided in a region facing edges 16 and 25 and close to a bending point of the L-shape corresponding to joint point B1 of two edges, that is, edges 16 and 25. In other words, power storage end 12 and power storage end 13 are preferably provided in a recess of substrate 3 with the L-shape such that discharging relay 6 and discharging relay 7 are positioned in one side and another side, respectively, with respect to line L301 connecting one of power storage end 12 and power storage end 13 to joint point B1.

In this Example, heat radiating part 2X of heatsink 2 contacting facing discharging relay 6 and discharging relay 7 has higher heat dissipating performance than heat radiating part 2Y of heatsink 2 contacting and facing charging relay 4 and charging relay 5 in order to have a higher cooling efficiency than discharging relay 6 and discharging relay 7 in which a temperature rise easily becomes larger than charging relay 4 and charging relay 5. Furthermore, in order to further enhance the heat dissipating efficiency in heat radiating part 2X of heatsink 2 contacting and facing discharging relay 6 and discharging relay 7, heat radiating part 2X and the conductor constituting output end 10 contact each other via heat transfer part 22. This configuration enhances thermal coupling between heat radiating part 2X and the conductor constituting output end 10, and enhances the heat dissipating efficiency in heat radiating part 2X.

Heat radiating part 2X and heat radiating part 2Y of heatsink 2 may be unitarily formed with each other or provided separately.

As mentioned above, in discharging relay 6 and discharging relay 7 corresponding to a discharge path from power storage element 23 to output end 10 and output end 11 in which a particularly large electric current flows, a distance between electrode 23A and electrode 23B of power storage element 23 is reduced. This configuration reduces DC resistance of the conductor suppresses heat generation. Furthermore, a temperature rise of disconnect device 1 can be suppressed particularly in discharging relay 6, discharging relay 7, and output end 10 in which heat is easily generated as the discharge path, the heat radiation efficiency of thermally coupled heatsink 2 is enhanced. As a result, the operation reliability of the entire disconnect device can be enhanced.

FIG. 4 is a side schematic diagram of another disconnect device 101 in accordance with the embodiment. In FIG. 4, components identical to those of disconnect device 1 shown in FIG. 1 and FIG. 2 are denoted by the same reference numerals. In disconnect device 101 shown in FIG. 4, heatsink 2 includes flow path 2Z configured to allow fluid to pass through. Since the flowing amount of the fluid per unit time in heat radiating part 2X facing discharging relay 6 and discharging relay 7 is larger than that of heat radiating part 2Y. Heat radiating part 2X is positioned in the upstream flow path where lower temperature fluid than heat radiating part 2Y flows easily. These configurations provide heat radiating part 2X with a larger cooling effect than heat radiating part 2Y.

The above-described Example shows an embodiment in which heat transfer part 18, heat transfer part 19, heat transfer part 20, heat transfer part 21, and heat transfer part 22 are provided separately. However, heat transfer part 18, heat transfer part 19, heat transfer part 20, heat transfer part 21, and heat transfer part 22 may be provided as a single layered heat transfer part. Furthermore, insulating layer 24 may be provided between heatsink 2 and each of heat transfer part 18, heat transfer part 19, heat transfer part 20, heat transfer part 21, and heat transfer part 22 (see FIG. 4). That is, substrate 3 may include insulating layer 24 provided at surface 3A of substrate 3. This configuration enhances an insulation property between heatsink 2 and the relays and the insulation property between heatsink 2 and conductors coupled to the relays while maintaining heat transfer property. Disconnect device 101 shown in FIG. 2 may include insulating layer 24, providing the same effect.

In the above-described Example, heat transfer part 18, heat transfer part 19, heat transfer part 20, and heat transfer part 22 are aligned in direction D1, and heat transfer part 21 and heat transfer part 22 are aligned in direction D2. these heat transfer parts are not necessarily aligned along a straight line, but may be arranged in a substantially straight line. Furthermore, in the above-described Example, direction D1 is perpendicular to direction D2. However, direction D1 is not necessarily completely perpendicular to direction D2, and may be substantially perpendicular to it. In other words, directions D1 and D2 cross each other, and the relays and heat transfer parts are aligned in direction D1 or D2 so that the region corresponding to heat radiating part 2X with high heat dissipating performance and the region corresponding to heat radiating part 2Y with lower heat dissipating performance than heat radiating part 2X are clear.

Charging relay 5 and discharging relay 6 out of the four relays disposed adjacent to each other are connected to the same electrodes out of electrodes 23A and 23B of power storage element 23. This configuration provides charging relay 5 and discharging relay 6 with the substantially same potential, hence facilitating the insulation property, and enhancing the reliability of disconnect device 1. Furthermore, charging relay 5 and discharging relay 6 are provided with substantially the same potential. This configuration provides a heatsink commonly for both charging relay 5 and discharging relay 6, and enhances the radiation property of charging relay 5 and discharging relay 6, accordingly enhancing the reliability of disconnect device 1. The above-mentioned heatsink may be thermally coupled to heatsink 2. For example, the heatsink may be disposed between substrate 3 and heatsink 2, and may be electrically insulated from heatsink 2.

INDUSTRIAL APPLICABILITY

A disconnect device of the present disclosure has an advantageous effect of enhancing operation reliability, and is useful for electronic equipment for various vehicles.

REFERENCE SIGNS LIST 1 disconnect device
2 heatsink
3 substrate
4 charging relay (first charging relay)
5 charging relay (second charging relay)

6 discharging relay (first discharging relay)
7 discharging relay (second discharging relay)
8 charging end (first charging end)
9 charging end (second charging end)
10 output end (first output end)
11 output end (second output end)
12 power storage end (first power storage end)
13 power storage end (second power storage end)
14 edge (first edge)
15 edge (second edge)
16 edge (third edge)
17 edge (fourth edge)
18 heat transfer part (first heat transfer part)
19 heat transfer part (second heat transfer part)
20 heat transfer part (third heat transfer part)
21 heat transfer part (fourth heat transfer part)
22 heat transfer part (fifth heat transfer part)
23 power storage element
24 insulating layer
25 edge (fifth edge)

The invention claimed is:

1. A disconnect device configured to operate together with a power storage element including a first electrode and a second electrode, the disconnect device comprising:
   a heatsink;
   a substrate having a first surface and a second surface opposite to the first surface and further having a first edge, a second edge, a third edge, and a fourth edge each connected to the first surface and the second surface, the first surface contacting the heatsink, the substrate including a first heat transfer part, a second heat transfer part, a third heat transfer part, a fourth heat transfer part, and a fifth heat transfer part which are provided along the second surface of the substrate;
   a first charging relay provided on the second surface of the substrate, the first charging relay contacting the first heat transfer part;
   a second charging relay provided on the second surface of the substrate, the second charging relay contacting the second heat transfer part;
   a first discharging relay provided on the second surface of the substrate, the first discharging relay contacting the third heat transfer part;
   a second discharging relay provided on the second surface of the substrate, the second discharging relay contacting the fourth heat transfer part;
   a first charging end and a second charging end which are led out from the first edge of the substrate;
   a first output end and a second output end which are led out from the second edge of the substrate, the first output end and a second output end being thermally coupled to the fifth heat transfer part;
   a first power storage end led out from the third edge or the fourth edge of the substrate, the first power storage end being configured to be connected to the first electrode of the power storage element; and
   a second power storage end led out from the third edge or the fourth edge of the substrate, the second power storage end being configured to be connected to the second electrode of the power storage element, wherein
   both the first discharging relay and the second discharging relay are disposed closer to the first power storage end and the second power storage end than both the first charging relay and the second charging relay are,
   the second edge of the substrate is positioned opposite to of the first edge of the substrate in a first direction,
   the first heat transfer part, the second heat transfer part, the third heat transfer part, and the fifth heat transfer part are arranged in the first direction,
   the fourth heat transfer part and the fifth heat transfer part are arranged in a second direction perpendicular to the first direction, and
   a heat dissipating performance of the heatsink on the third heat transfer part, the fourth heat transfer part, and the fifth heat transfer part of the substrate is higher than a heat dissipating performance of the heatsink on the first heat transfer part and the second heat transfer part of the substrate.

2. The disconnect device according to claim 1, wherein the first edge and the second edge of the substrate extend in parallel to each other.

* * * * *